(12) United States Patent
Ishizuya et al.

(10) Patent No.: US 11,502,276 B2
(45) Date of Patent: Nov. 15, 2022

(54) ORGANIC ELECTROLUMINESCENT ELEMENT AND LIGHT-EMITTING DEVICE

(71) Applicant: CANON KABUSHIKI KAISHA, Tokyo (JP)

(72) Inventors: Koji Ishizuya, Fujisawa (JP); Hiroaki Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 324 days.

(21) Appl. No.: 16/792,019

(22) Filed: Feb. 14, 2020

(65) Prior Publication Data

US 2020/0274103 A1  Aug. 27, 2020

(30) Foreign Application Priority Data

Feb. 22, 2019 (JP) ............................. JP2019-030064

(51) Int. Cl.
| | |
|---|---|
| *H01L 51/50* | (2006.01) |
| *H01L 51/52* | (2006.01) |
| *H01L 27/32* | (2006.01) |
| *G02F 1/133* | (2006.01) |
| *G02F 1/1335* | (2006.01) |

(52) U.S. Cl.
CPC ........ *H01L 51/5275* (2013.01); *H01L 27/322* (2013.01); *H01L 51/5253* (2013.01); *G02F 1/133514* (2013.01); *H01L 27/3211* (2013.01); *H01L 27/3213* (2013.01); *H01L 51/5056* (2013.01); *H01L 51/5072* (2013.01); *H01L 51/5088* (2013.01); *H01L 51/5096* (2013.01); *H01L 2251/301* (2013.01)

(58) Field of Classification Search
CPC ........... H01K 51/5275; H01K 51/5253; H01K 51/5056; H01K 51/5072; H01K 51/5096; H01K 51/5088; H01K 27/322; H01K 27/3211; H01K 27/3213; H01K 2251/301; G02F 1/133514; G02F 2001/133357
See application file for complete search history.

(56) References Cited

U.S. PATENT DOCUMENTS

| | | | |
|---|---|---|---|
| 10,636,851 B2* | 4/2020 | Ukigaya | ............. H01L 27/3246 |
| 2008/0100202 A1* | 5/2008 | Cok | ...................... C23C 16/345 |
| | | | 313/503 |

(Continued)

FOREIGN PATENT DOCUMENTS

JP         2012-216495 A     11/2012

*Primary Examiner* — Ida M Soward
(74) *Attorney, Agent, or Firm* — Canon U.S.A., Inc., IP Division

(57) ABSTRACT

An organic electroluminescent element includes a first electrode, a second electrode, and an organic compound layer disposed between the first and second electrodes. A protective layer and a planarization layer are disposed in this order on the light emission side of whichever of the first and second electrodes is closer to the light emission side. A surface of the protective layer adjacent to the planarization layer has an uneven shape. The planarization layer is in contact with the protective layer. A surface of the planarization layer away from the protective layer is flat. The refractive index of the planarization layer is equal to or lower than that of the protective layer and equal to or higher than that of a light emission medium in contact with the planarization layer.

14 Claims, 11 Drawing Sheets

(56) References Cited

U.S. PATENT DOCUMENTS

| | | | | |
|---|---|---|---|---|
| 2010/0188376 | A1* | 7/2010 | Sagawa | H05B 33/22 |
| | | | | 313/504 |
| 2012/0038267 | A1* | 2/2012 | Hanamura | H01L 27/322 |
| | | | | 313/504 |
| 2014/0042408 | A1* | 2/2014 | Akagawa | H01L 51/5253 |
| | | | | 257/40 |
| 2017/0047385 | A1* | 2/2017 | Teng | H01L 27/3246 |
| 2018/0151830 | A1* | 5/2018 | Furuta | H01L 51/5209 |
| 2018/0174508 | A1* | 6/2018 | Jeong | H01L 51/5218 |
| 2018/0315946 | A1* | 11/2018 | Nagatomo | H01L 51/5203 |
| 2019/0393285 | A1* | 12/2019 | Kato | H01L 27/322 |

\* cited by examiner

ORGANIC ELECTROLUMINESCENT ELEMENT AND LIGHT-EMITTING DEVICE

BACKGROUND OF THE INVENTION

Field of the Invention

The present disclosure relates to an organic electroluminescent element and a light-emitting device including the organic electroluminescent element.

Description of the Related Art

Organic electroluminescent elements are light-emitting elements each including a pair of electrodes and an organic compound layer disposed therebetween. Organic electroluminescent elements are being put to practical use as light-emitting elements, such as light sources for thin-screen displays, lighting devices, head-mounted displays, and print heads of electrophotographic printers, by taking advantage of their good features such as surface light-emitting characteristics, lightness in weight, and visibility.

There is a growing demand for higher definition of organic electroluminescent devices. In particular, a system including organic electroluminescent elements that emit white light and color filters (hereinafter, referred to as a "white+CF system") is known. In the white+CF system, multiple color filters having different chromatic dispersions for light to be absorbed are disposed in the emission direction of white light from the organic electroluminescent elements. For example, the color filters are disposed in such a manner that the emission colors of light passing through the color filters are red, green, and blue, thereby enabling full-color display by additive color mixing. In the white+CF system, an organic compound layer need not be formed for each electroluminescent element. It is thus easy to provide higher-definition electroluminescent elements.

Higher-definition organic electroluminescent devices, however, suffer from the disadvantage of light bleeding in light-emitting regions, i.e., are disadvantageous in that actual light-emitting regions are larger than designed light-emitting regions. Additionally, organic electroluminescent display devices of the white+CF system suffer from the disadvantage of a decrease in the color purity of an emission color. One of the causes of such disadvantages is stray light due to uneven shapes of protective layers.

It is known that about 20% of light emitted from an organic electroluminescent element is extracted into air and the remaining about 80% of light acts as guided light that propagates through an organic compound layer and a protective layer. The guided light propagates in the light-emitting device in a direction parallel to a substrate surface by reflection from a lower electrode, an insulating layer, an upper electrode, a protective layer, and so forth. When surfaces of the lower electrode, the upper electrode, the protective layer, and so forth are parallel to each other, the guided light propagates easily in the direction parallel to the substrate surface of the light-emitting device. When a structure that does not satisfy waveguide conditions is present, the guided light becomes stray light due to reflection, refraction, or scattering. A portion of the stray light propagates in a direction perpendicular to the substrate surface. The stray light causes light bleeding in a light-emitting region and a decrease in the color purity of the emission color.

Japanese Patent Laid-Open No. 2012-216495 discloses that an adhesive layer is disposed between a protective layer and a color filter, but the uneven shape of the protective layer is not regarded as a particular disadvantage.

To reduce the generation of stray light, it is necessary to reduce reflection, scattering, and refraction due to uneven shapes of protective layers of organic electroluminescent elements. An example of a method for reducing reflection, scattering, and refraction is a method for removing the uneven shape of a protective layer. For example, the uneven shape can be planarized by polishing the surface of the protective layer using, for example, a chemical-mechanical polishing (CMP) method. Unfortunately, if the protective layer is polished by the CMP method, the film thickness of the protective layer is decreased to decrease the waterproof performance of the protective layer; thus, reliability becomes an issue. After the formation of a thick protective layer in advance, the protective layer can be polished by the CMP method. However, the long formation time of the protective layer disadvantageously increases costs.

SUMMARY OF THE INVENTION

The present disclosure provides an organic electroluminescent element in which light bleeding and color mixture in a light-emitting region are reduced by suppressing stray light due to the uneven shape of a protective layer without decreasing reliability or increasing costs.

According to one aspect of the present disclosure, an organic electroluminescent element includes a first electrode, a second electrode, and an organic compound layer disposed between the first electrode and the second electrode, in which a protective layer and a planarization layer are disposed in this order on the light emission side of whichever of the first electrode and the second electrode is closer to the light emission side, a surface of the protective layer adjacent to the planarization layer has an uneven shape, the planarization layer is in contact with the protective layer, a surface of the planarization layer away from the protective layer is flat, and a refractive index of the planarization layer is equal to or lower than the refractive index of the protective layer and equal to or higher than the refractive index of a light emission medium in contact with the planarization layer.

According to another aspect of the present disclosure, an organic electroluminescent element includes a first electrode, a second electrode, and an organic compound layer disposed between the first electrode and the second electrode, in which a protective layer and a planarization layer are disposed in this order on the light emission side of whichever of the first electrode and the second electrode is closer to the light emission side, a surface of the protective layer adjacent to the planarization layer has an uneven shape, the planarization layer is in contact with the protective layer, a surface of the planarization layer away from the protective layer is flat, the protective layer is composed of at least one member selected from the group consisting of silicon nitride, silicon oxynitride, silicon oxide, aluminum oxide, and titanium oxide, the planarization layer is composed of a composite material containing a polymeric material and at least one member selected from the group consisting of titanium oxide, zirconium oxide, diamond, silicon nitride, and barium titanate, or is composed of a polymeric material containing at least one element selected from the group consisting of sulfur, bromine, iodine, and phosphorus, and a light emission medium in contact with the planarization layer is composed of an inorganic material or an organic material.

Further features of the present disclosure will become apparent from the following description of exemplary embodiments with reference to the attached drawings.

DESCRIPTION OF THE EMBODIMENTS

Organic Electroluminescent Element and Light-Emitting Device

An organic electroluminescent element and a light-emitting device according to embodiments of the present disclosure will be described below with reference to the attached drawings. Well-known or publicly known techniques in the art are applied to components that are not specifically illustrated or described in the present specification. The present invention is not limited to these embodiments described below.

First Embodiment

Figure 1:
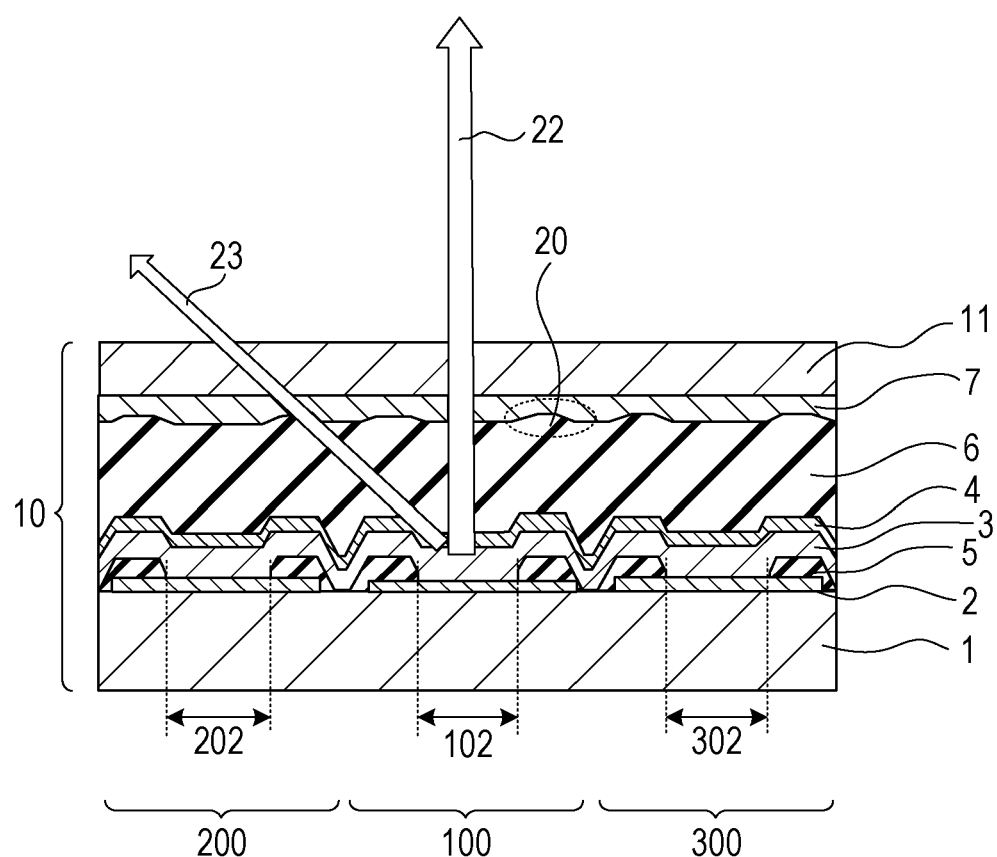
FIG. 1 is a cross-sectional view illustrating an example of a light-emitting device according to a first embodiment.

FIG. 1 is a schematic cross-sectional view illustrating the structure of a light-emitting device according to an embodiment of the present disclosure, the light-emitting device including multiple light-emitting elements, at least one of the light-emitting elements being an organic electroluminescent element according to an embodiment of the present disclosure. The light-emitting device illustrated in FIG. 1 includes at least a first organic electroluminescent element 100 on a substrate 1. The first organic electroluminescent element 100 includes an organic compound layer 3 disposed between a first electrode (lower electrode) 2 and a second electrode (upper electrode) 4. The first organic electroluminescent element 100 also includes a protective layer 6, a planarization layer 7, and a light emission medium 11, disposed in this order, on the light emission side of the upper electrode 4, which is an electrode closer to the light emission side. As illustrated in FIG. 1, a second organic electroluminescent element 200 and a third organic electroluminescent element 300 may also be disposed. This embodiment will be described in detail below. In this embodiment, the lower electrode 2 is an anode, and the upper electrode 4 is a cathode. However, the lower electrode 2 may be a cathode, and the upper electrode 4 may be an anode.

Substrate 1

The substrate 1 is composed of a material that can support the lower electrode 2, the organic compound layer 3, and the upper electrode 4. Examples of the material include quartz, glass, silicon wafers, resins, and metals. A switching element, such as a transistor, conductor lines, and an interlayer insulating film (not illustrated) may be provided on or in the substrate 1. The interlayer insulating film may be composed of any material as long as a contact hole can be formed in order to provide electrical conduction between the lower electrode 2 and the conductor line and as long as insulation from a conductor line that is not connected can be provided. Examples of such a material that can be used include resins, such as polyimide, silicon oxide, and silicon nitride.

Lower Electrode 2 (Anode)

The lower electrode 2 of the first organic electroluminescent element 100 can be composed of a metal material having a visible light reflectance of 50% or more from the viewpoint of achieving good luminous efficiency. Specifically, a metal, such as Al or Ag, or an alloy of the metal and an additive, such as Si, Cu, Ni, Nd, or Ti, can be used. The lower electrode 2 may include a barrier layer on a surface thereof on the light emission side. The barrier layer may be composed of a metal, such as Ti, W, Mo, or Au, an alloy thereof, or a transparent conductive oxide, such as ITO or IZO. The formation of the lower electrode 2 may be performed by photolithography.

In the case where the second organic electroluminescent element 200 and the third organic electroluminescent element 300 are disposed, the lower electrodes 2 are electrically isolated from each other. To optimize optical interference, the thickness of the films of the transparent conductive oxide of the lower electrodes 2 of the first organic electroluminescent element 100, the second organic electroluminescent element 200, and the third organic electroluminescent element 300 may be different from one element to another.

Organic Compound Layer 3

The organic compound layer 3 is disposed on the lower electrode 2 of the first organic electroluminescent element 100. The organic compound layer 3 includes at least a light-emitting layer and may be formed of multiple layers. Examples of the multiple layers include a hole injection layer, a hole transport layer, an electron blocking layer, a light-emitting layer, a hole blocking layer, and an electron transport layer. Light is emitted from the light-emitting layer in the organic compound layer 3 by recombination of holes injected from an anode with electrons injected from a cathode in the light-emitting layer. The light-emitting layer may have a single-layer structure or multilayer structure. Any of the light-emitting layers may contain a red-light-emitting material, a green-light-emitting material, and a blue-light-emitting material. The emission colors may be mixed together to generate white light. Any of the light-emitting layers may contain light-emitting materials in complementary color relationship, such as a blue-light-emitting material and a yellow-light-emitting material.

In the case where the second organic electroluminescent element 200 and the third organic electroluminescent element 300 are disposed, the organic compound layer 3 may extend over the lower electrode 2 of the first organic electroluminescent element 100, the lower electrode 2 of the second organic electroluminescent element 200, and the lower electrode 2 of the third organic electroluminescent element 300. The whole or part of the organic compound layer 3 of the first organic electroluminescent element 100, the second organic electroluminescent element 200, and the third organic electroluminescent element 300 may be patterned for each element.

An electron injection layer (not illustrated) may be disposed between the organic compound layer 3 and the upper electrode 4. The electron injection layer can contain a compound having strong electron-donating properties. Examples of the compound having strong electron-donating properties include metals having strong electron-donating properties, such as alkali metals, e.g., lithium and cesium, alkaline-earth metals, e.g., calcium and barium, and compounds thereof. Further examples thereof include organometallic complexes in which the metals and organic compounds are bonded together. These materials may be used alone in the form of a single layer or used in the form of a film composed of a mixture of the material and the organic compound used for the electron injection layer.

For the formation of the organic compound layer 3, a dry process, such as a vacuum evaporation method, an ionized evaporation method, sputtering, or plasma, may be employed. Alternatively, instead of the dry process, it is also possible to employ a wet process in which a material is dissolved in an appropriate solvent and then a film is formed by a known coating method, such as spin coating, dipping, a casting method, a Langmuir-Blodgett (LB) technique, or an ink-jet method.

In the case where the layer is formed by, for example, the vacuum evaporation method or the solution coating method, crystallization is less likely to occur, thus providing good stability with time. In the case of forming a film by the coating method, the film may be formed in combination with an appropriate binder resin. Non-limiting examples of the binder resin include poly(vinyl carbazole) resins, polycarbonate resins, polyester resins, acrylonitrile butadiene styrene (ABS) resins, acrylic resins, polyimide resins, phenolic resins, epoxy resins, silicone resins, and urea resins. These binder resins may be used alone as a homopolymer or a copolymer or in combination as a mixture. Furthermore, additives, such as a known plasticizer, antioxidant, and ultraviolet absorbent, may be used, as needed.

Upper Electrode 4 (Cathode)

The upper electrode 4 is disposed on the organic compound layer 3 of the first organic electroluminescent element 100 and transmits light. The upper electrode 4 may be composed of a semi-transmissive material that transmits a portion of light reached its surface and reflects another portion of the light, i.e., transflective material. Examples of the material of the upper electrode 4 include transparent materials, such as transparent conductive oxides; and semi-transmissive materials, such as elemental metals, e.g., aluminum, silver, and gold, alkali metals, e.g., lithium and cesium, alkaline-earth metals, e.g., magnesium, calcium, and barium, and alloy materials containing these metal materials. In particular, as the semi-transmissive material, an alloy mainly containing magnesium or silver can be used. The composition ratio of the alloy may be freely selected and, for example, 1:1.

These electrode materials may be used alone or in combination of two or more. The upper electrode 4 may have a single-layer structure or multilayer structure.

As the formation method of the upper electrode 4, a dry process, such as a vacuum evaporation method, an ionized evaporation method, sputtering, or plasma, may be employed. Alternatively, instead of the dry process, it is also possible to employ a wet process in which a material is dissolved in an appropriate solvent and then a film is formed by a known coating method, such as spin coating, dipping, a casting method, a Langmuir-Blodgett (LB) technique, or an ink-jet method.

In the case where the second organic electroluminescent element 200 and the third organic electroluminescent element 300 are disposed, the upper electrode 4 may extend over the organic compound layer 3 of the first organic electroluminescent element 100, the organic compound layer 3 of the second organic electroluminescent element 200, and the organic compound layer 3 of the third organic electroluminescent element 300.

Insulating Layer 5

The light-emitting device according to the embodiment may include an insulating layer 5 in the peripheral portion of the first organic electroluminescent element 100. That is, the insulating layer 5 covers the end portion of the lower electrode 2 of the first organic electroluminescent element 100 and includes an aperture portion at which a portion of the lower electrode 2 is exposed. The insulating layer 5 is disposed in order to accurately provide a first light-emitting region 102 having a desired shape. If the insulating layer 5 is not provided, the first light-emitting region 102 is defined by the shape of the lower electrode 2. The insulating layer 5 is composed of an inorganic material, such as silicon nitride (SiN), silicon oxynitride (SiON), or silicon oxide (SiO). The insulating layer 5 can be formed by a known technique, such as a sputtering method or a chemical vapor deposition (CVD) method. The insulating layer 5 can also be composed of an organic material, such as an acrylic resin or a polyimide resin.

Protective Layer 6

The light-emitting device according to the embodiment includes the protective layer 6 covering at least the first organic electroluminescent element 100. The protective layer 6 can contain an inorganic material that transmits light and that has extremely low permeability to oxygen and moisture from the outside. Examples of the inorganic material that can be used include silicon nitride (SiN), silicon oxynitride (SiON), silicon oxide ($SiO_x$), aluminum oxide ($Al_2O_3$), and titanium oxide ($TiO_2$). In particular, SiN, SiON, or $Al_2O_3$ can be used as the inorganic material in view of its sealing performance. The protective layer 6 can be formed by a chemical vapor deposition (CVD) method, an atomic layer deposition (ALD) method, or a sputtering method. The protective layer 6 may have a single-layer structure or a laminated structure obtained by combining the foregoing materials and the forming methods as long as it has sufficient moisture barrier performance.

In the case where the second organic electroluminescent element 200 and the third organic electroluminescent element 300 are disposed, the protective layer 6 may extend over and be common to the upper electrode 4 of the first organic electroluminescent element 100, the upper electrode 4 of the second organic electroluminescent element 200, and the upper electrode 4 of the third organic electroluminescent element 300.

The surface of the protective layer 6 adjacent to the planarization layer has an uneven shape 20 corresponding to the shape of a structure disposed on the opposite side of the protective layer 6 from the planarization layer 7. For example, in the case where the insulating layer 5 is disposed, the uneven shape 20 corresponding to the shape of the insulating layer 5 is provided on the surface of the protective layer 6 adjacent to the planarization layer 7. In the case where the insulating layer 5 is not disposed, the uneven shape 20 corresponding to the shape of the lower electrode 2 is provided on the surface of the protective layer 6 adjacent to the planarization layer 7. In these cases, the uneven shape 20 is provided in the peripheral region of the first light-emitting region 102 when viewed in plan. In the case where the organic compound layer 3 has different thicknesses, i.e., different optical interference structures, in the first organic electroluminescent element 100, the second organic electroluminescent element 200, and the third organic electroluminescent element 300, the uneven shape 20 is provided near each of the boundary regions between the adjacent first and second organic electroluminescent elements 100 and 200 and between the adjacent first and third organic electroluminescent elements 100 and 300 when viewed in plan.

Planarization Layer 7

The planarization layer 7 is disposed in contact with the protective layer 6. A surface of the planarization layer 7 away from the protective layer 6, i.e., the surface of the planarization layer 7 adjacent to the light emission medium 11, has a flat shape. The surface of the planarization layer 7 adjacent to the protective layer 6 has a shape corresponding to the uneven shape 20 of the protective layer 6.

The planarization layer 7 can be formed by a wet process, such as a spin coating method, a dip coating method, a slit coating method, or a blade coating method. The use of the wet process facilitates the formation of the flat surface of the planarization layer 7 adjacent to the light emission medium 11. The planarization layer 7 formed by the wet process can then be cured by heating or ultraviolet (UV) irradiation.

The planarization layer 7 can be composed of a composite material containing a polymeric material and at least one selected from the group consisting of titanium oxide, zirconium oxide, diamond, silicon nitride, and barium titanate. An example of the composite material is a composite material in which titanium oxide or the like is dispersed in a polymeric material. A material to be dispersed can have a particle size of 25 nm or less in order to reduce scattering. Alternatively, the planarization layer 7 can be composed of a polymeric material containing at least one element selected from the group consisting of sulfur, bromine, iodine, and phosphorus. Examples of the polymeric material include acrylic resins.

Light Emission Medium 11

The light emission medium 11 is in contact with the planarization layer 7. The light emission medium 11 only needs to be composed of a light-transmitting material in order to emit light from a light-emitting device 10. The light emission medium 11 may be composed of an inorganic material, an organic material, or a gas, such as air or nitrogen. In this embodiment, the light emission medium 11 is a member included in the organic electroluminescent element. The present invention, however, is not limited thereto. The light emission medium 11 need not be a member included in the organic electroluminescent element and may be a medium, such as a gas present around the organic electroluminescent element, as long as it is a medium in contact with the planarization layer 7. In the case where the light emission medium is a gas, the light emission medium may be formed of a layer enclosing a gas and serving as a component of the organic electroluminescent element or may be formed of a gas present around the organic electroluminescent element.

Refractive Index

The refractive index of the planarization layer 7 is equal to or lower than the refractive index of the protective layer 6 and equal to or higher than the refractive index of the light emission medium 11. This enables the suppression of the bleeding of emitted light in the light-emitting device according to this embodiment. In this embodiment, guided light beams of light components 22 and 23 emitted from the first organic electroluminescent element 100 are less likely to be reflected, scattered, or refracted at the interface between the uneven shape 20 of the protective layer 6 and the planarization layer 7. Reflected, scattered, or refracted light becomes stray light, thereby disadvantageously resulting in a light emission pattern actually broader than a designed light emission region when viewed in a direction perpendicular to the substrate surface on the light emission side of the light-emitting device 10. In this embodiment, reflection, scattering, and refraction do not easily occur, so that stray light is not easily generated. Accordingly, it is possible to obtain a light emission pattern equivalent to a designed light emission region. From this viewpoint, the difference in refractive index between the protective layer 6 and the planarization layer 7 can be small. In particular, the difference in refractive index can be smaller than 0.5.

Reflection from the planarization layer 7 and the light emission medium 11 can be suppressed in view of luminous efficiency. Accordingly, a difference in refractive index between the planarization layer 7 and the light emission medium 11 can be small. In particular, the difference in refractive index can be smaller than 0.5.

In the case where the light emission medium is a member included in the organic electroluminescent element, the refractive index of each of the protective layer 6 and the planarization layer 7 is a "refractive index at the peak wavelength of the emission spectrum of light passed through the light emission medium". In the case where the light emission medium is not a member included in the organic electroluminescent element, the refractive index of each of the protective layer 6 and the planarization layer 7 is a "refractive index at the peak wavelength of the emission spectrum of light incident on the light emission medium". The refractive index of the light emission medium is a "refractive index at a wavelength at which the maximum transmittance of the light emission medium is obtained".

Second Embodiment

Figure 2:
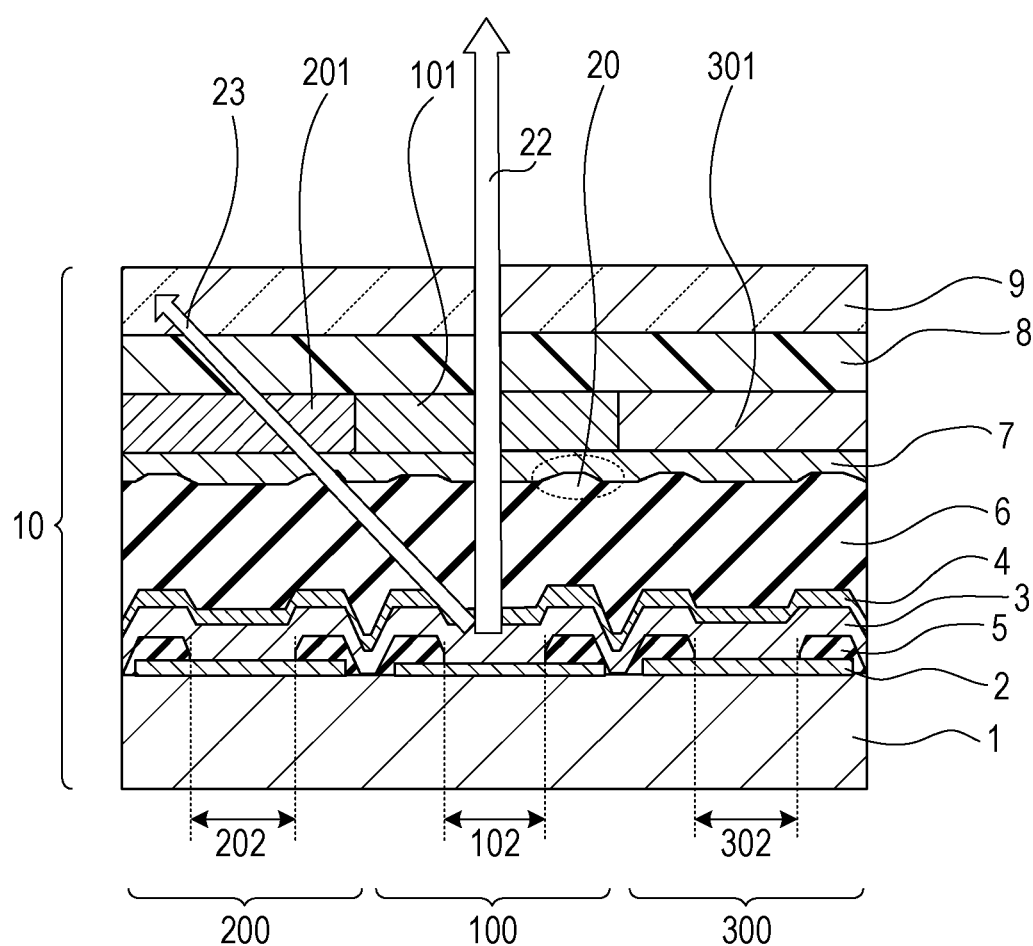
FIG. 2 is a cross-sectional view illustrating an example of a light-emitting device according to a second embodiment.

FIG. 2 is a schematic cross-sectional view illustrating the structure of a light-emitting device according to an embodiment, the light-emitting device including multiple light-emitting elements, at least one of the light-emitting elements being an organic electroluminescent element according to an embodiment of the present disclosure. In this embodiment, color filters 101, 201, and 301 are disposed. In FIG. 2, reference numeral 8 denotes a filling layer, and reference numeral 9 denotes an opposite substrate 9.

As illustrated in FIG. 2, each of the second organic electroluminescent element 200 and the third organic electroluminescent element 300 is disposed adjacent to the first organic electroluminescent element 100. The first color filter 101 is disposed on the light emission side of the planarization layer 7 of the first organic electroluminescent element 100. The second color filter 201 is disposed on the light emission side of the planarization layer 7 of the second organic electroluminescent element 200. The third color filter 301 is disposed on the light emission side of the third organic electroluminescent element 300. The first color filter 101, the second color filter 201, and the third color filter 301 transmit different wavelength components of light; thus, light components passed through these color filters have different chromaticity values.

In FIG. 2, the color filters are disposed in contact with the planarization layer 7. In other words, FIG. 2 illustrates an example in which the color filters are disposed as light emission media in contact with the planarization layer 7. Thus, the refractive index of the planarization layer 7 is equal to or lower than the refractive index of the protective layer 6 and equal to or higher than the refractive indices of the first color filter 101, the second color filter 201, and the third color filter 301. The refractive index of each of the color filters is a refractive index at a wavelength at which the maximum transmittance of the color filter is obtained. SiN that can be used for the protective layer 6 has a refractive index of about 2.0 to about 2.1, and each color filter has a refractive index of about 1.5 to about 1.7. Thus, in the case where the color filters are directly disposed on the planarization layer 7, the planarization layer 7 can have a refractive index of 1.7 or more and 2.0 or less.

Figure 3:
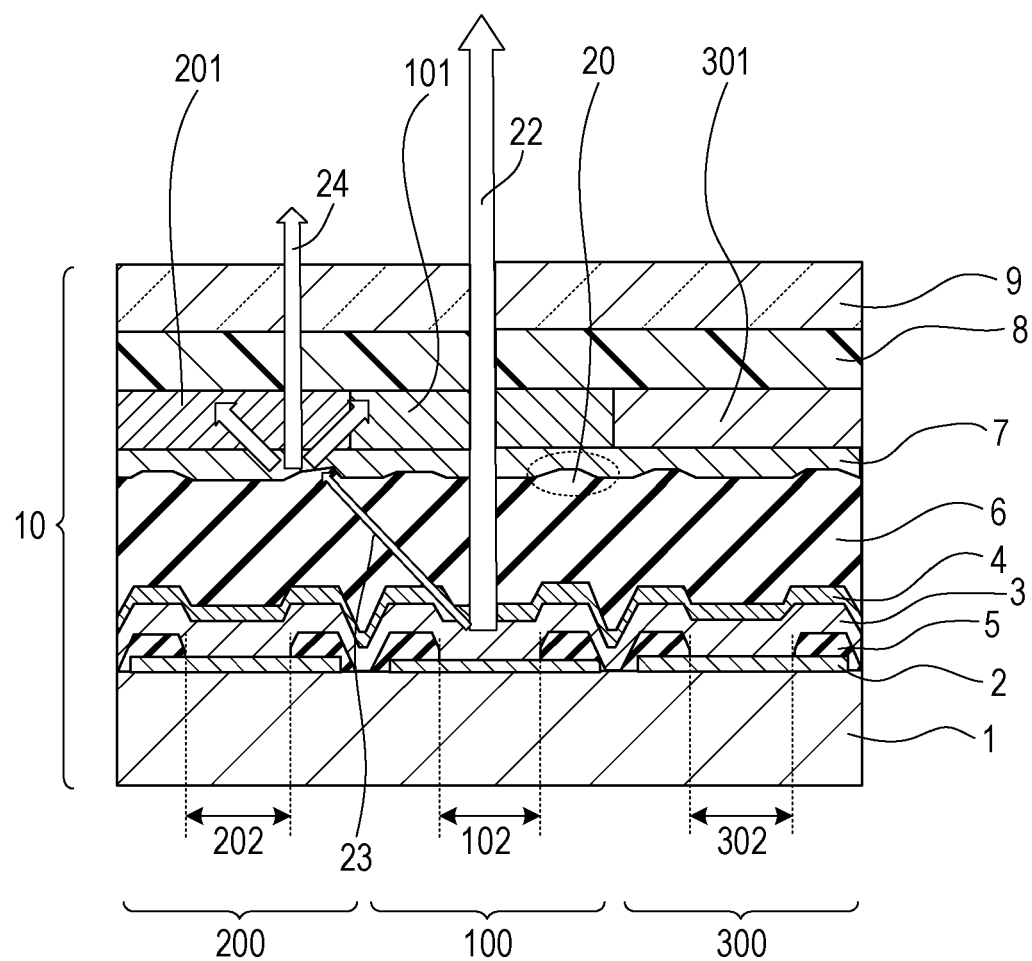
FIG. 3 is a cross-sectional view illustrating a comparative example of a light-emitting device according to the second embodiment.

If the refractive index of the planarization layer 7 is outside the range of a value equal to or lower than the refractive index of the protective layer 6 to a value equal to or higher than the refractive indices of the color filters 101, 201, and 301, as illustrated in FIG. 3, the light components 22 and 23 emitted from the first organic electroluminescent element 100 partially become stray light 24 at the uneven shape 20 of the protective layer 6 at the second organic electroluminescent element 200, and the stray light 24 passes through the second color filter 201. In such a case, the light (stray light 24) transmitted through the second color filter 201 is mixed with the light component 22 transmitted through the first color filter 101 to decrease the color purity of the light emitted from the first organic electroluminescent element 100.

In contrast, in this embodiment, the generation of stray light is suppressed as in the first embodiment. As illustrated in FIG. 2, the light components 22 and 23 emitted from the first organic electroluminescent element 100 are less likely to generate stray light at the uneven shape 20 of the protective layer 6, thus suppressing a light component emitted from the second color filter 201 of the adjacent second organic electroluminescent element 200. Accordingly, in the light components 22 and 23 emitted from the first organic electroluminescent element 100, light emitted in the direction perpendicular to the substrate surface of the light-emitting device 10 consists of mostly a light component (light component 22) emitted from the color filter 101 and a small amount of a light component emitted from the second color filter 201. It is thus possible to obtain light having a low degree of color mixture and high color purity.

Figure 4:
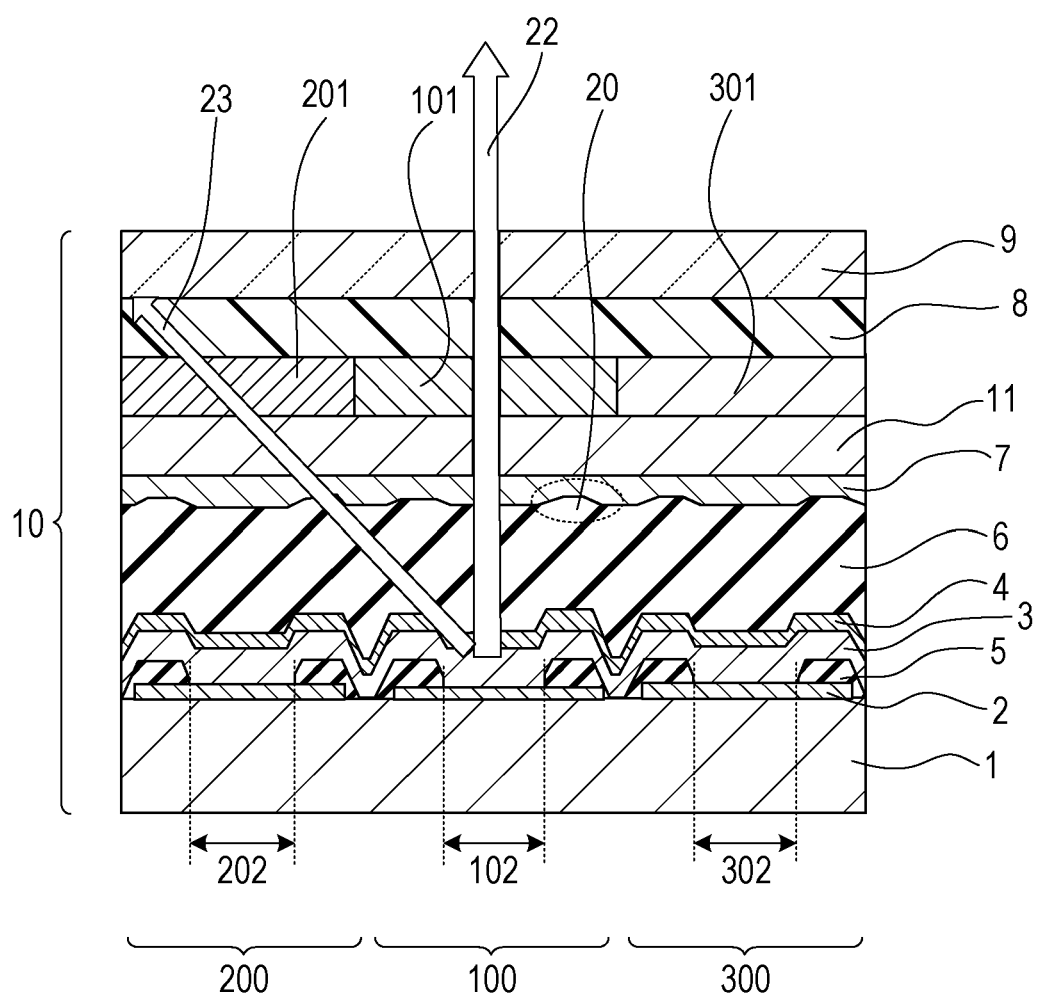
FIG. 4 is a cross-sectional view illustrating another example of a light-emitting device according to the second embodiment.

In the case where color filters are disposed on the light emission medium 11 as illustrated in FIG. 4, the refractive index of the planarization layer 7 is equal to or lower than the refractive index of the protective layer 6 and equal to or higher than the refractive index of the light emission medium 11.

The color filters are composed of dye materials that absorb specific wavelengths. As the dye materials, known materials, such as disazo-based materials, phthalocyanine-based materials, dioxazine-based materials, quinacridone-based materials, perylene-based materials, and anthraquinone-based materials, can be used. A material in which such a dye material is dispersed in a resin material can also be used. As the resin material, a known material, such as an acrylic resin, a polyimide-based resin, a polyester-based resin, or an epoxy-based resin, can be used.

Each of the color filters is formed by applying a color resist and patterning the resist using lithography. The color resist is composed of, for example, a photocurable resin. A portion of the color resist irradiated with, for example, ultraviolet radiation is cured to form a pattern. An opposite substrate 9 including color filters formed in advance may be combined so as to oppose the substrate on which the organic electroluminescent element is disposed. For example, the opposite substrate 9 may be formed of a glass substrate having flat upper and lower surfaces. For example, the filling layer 8 composed of a photocurable acrylic resin may be disposed between the opposite substrate 9 and the color filters 101, 201, and 301.

In this embodiment, each of the first organic electroluminescent element 100, the second organic electroluminescent element 200, and the third organic electroluminescent element 300 can be regarded as a sub-pixel, and the three sub-pixels can be regarded as one main pixel. In particular, the sub-pixels can be sub-pixels of three colors: red, green, and blue. The additive color mixture of the emission colors of these sub-pixels enables full-color display. Any pattern selected from a stripe pattern, a square pattern, a delta pattern, and the Bayer pattern may be used for the planar arrangement of the first organic electroluminescent element 100, the second organic electroluminescent element 200, and the third organic electroluminescent element 300. The main pixels can be arranged in a matrix to provide an organic electroluminescent display device with a large number of pixels.

Device Including Organic Electroluminescent Element

The organic electroluminescent element according to the embodiment can be used as a component member of a display device or a lighting device. Other applications include exposure light sources for electrophotographic image forming apparatuses, backlights for liquid crystal displays, and light-emitting devices including white light sources and color filters.

The display device may be an image information-processing device having an image input unit that receives image information from an area or linear CCD sensor, a memory card, or any other source, an information-processing unit that processes the input information, and a display unit that displays the input image. The display unit of an image pickup apparatus or an ink-jet printer may have a touch-screen feature. The driving mode of the touch-screen feature may be, but is not limited to, an infrared mode, an electrostatic capacitive mode, a resistive film mode, or an electromagnetic inductive mode. The display device may also be used for a display unit of a multifunction printer.

In the organic electroluminescent element according to the embodiment, the emission luminance is controlled by TFT elements, which are an example of switching elements. By arranging the organic luminescent elements in a plane, an image can be displayed at respective emission luminance levels. The switching elements according to the embodiment are not limited to the TFT elements and may be low-temperature polysilicon transistors or active-matrix drivers formed on a substrate, such as a Si substrate. The expression "on a substrate" can also be said to be "in the substrate". Whether transistors formed in the substrate or TFT elements are used is selected, depending on the size of a display unit. For example, when the display unit has a size of about 0.5 inches, organic electroluminescent elements can be disposed on a Si substrate. The use of the device including the organic electroluminescent element according to the embodiment enables stable display with good image quality even for a long time display.

Display Device

Figure 5:
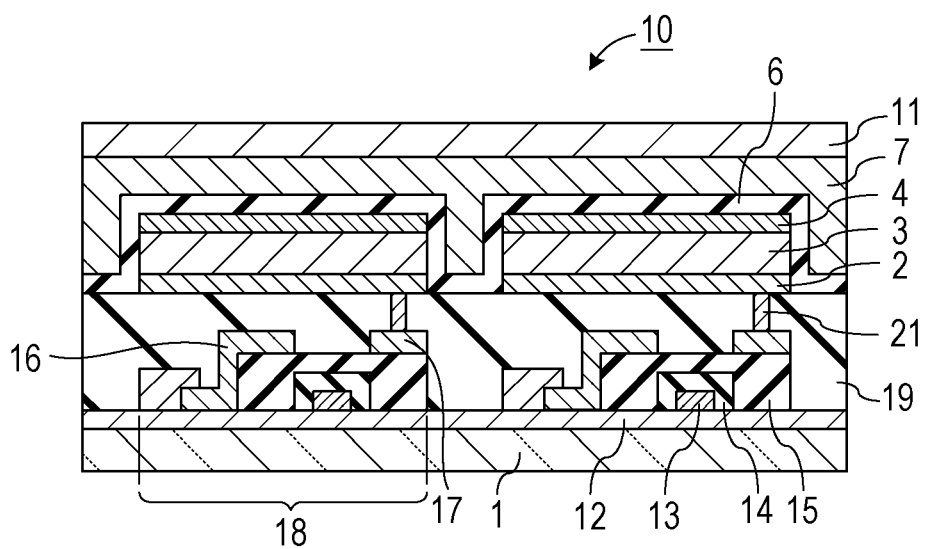
FIG. 5 is a schematic cross-sectional view of an example of a display device according to an embodiment.

FIG. 5 is a schematic cross-sectional view of an example of a display device according to the embodiment and illustrates an example of a display device including organic electroluminescent elements and TFT elements connected to the organic electroluminescent elements. The TFT elements are an example of active elements. The display device according to the embodiment may include red, green, and blue color filters. The red, green, and blue color filters may be arranged in a delta pattern.

The light-emitting device 10 illustrated in FIG. 5 includes the substrate 1 composed of, for example, glass and a moisture-proof film 12 thereon, the moisture-proof film 12 being configured to protect TFT elements 18 or organic compound layers 3. Each of the TFT elements 18 includes a gate electrode 13 composed of a metal, a gate insulating film 14, a semiconductor layer 15, a drain electrode 16, and a source electrode 17. An insulating film 19 is disposed on the TFT elements 18. The lower electrode (anode) 2 included in each organic electroluminescent element is coupled to the source electrode 17 through a contact hole 21. The way of electric coupling between the electrodes (the lower electrode 2 and the upper electrode 4 (cathode)) included in each organic electroluminescent element and the electrodes (the source electrode 17 and the drain electrode 16) included in a corresponding one of the TFT elements is not limited to the configuration illustrated in FIG. 5. It is sufficient that one of the upper electrode 4 and the lower electrode 2 is electrically coupled to one of the source electrode 17 and the drain electrode 16 of the TFT element. Each organic compound layer 3 of the light-emitting device 10 illustrated in FIG. 5 is illustrated as a single layer; however, the organic compound layer 3 may be formed of multiple layers.

In the light-emitting device 10 illustrated in FIG. 5, the transistors are used as switching elements; however, metal-insulator-metal (MIM) elements may be used as switching elements instead. The transistors used in the light-emitting device 10 illustrated in FIG. 5 are not limited to transistors formed using a single-crystal silicon wafer and may be thin-film transistors each having an active layer on the insulating surface of a substrate. Examples of the material of the active layer include single-crystal silicon; non-single-crystal silicon materials, such as amorphous silicon and microcrystalline silicon; and non-single-crystal oxide semi-conductors, such as indium-zinc oxide and indium-gallium-zinc oxide. Thin-film transistors are also referred to as TFT elements. The transistors in the display device 10 illustrated in FIG. 5 may be formed in the substrate, such as a Si substrate. The expression "formed in the substrate" used here indicates that the transistors are produced by processing the substrate itself, such as a Si substrate. That is, in the case where the transistors are included in the substrate, the substrate and the transistors can also be deemed to be integrally formed.

Figure 6:
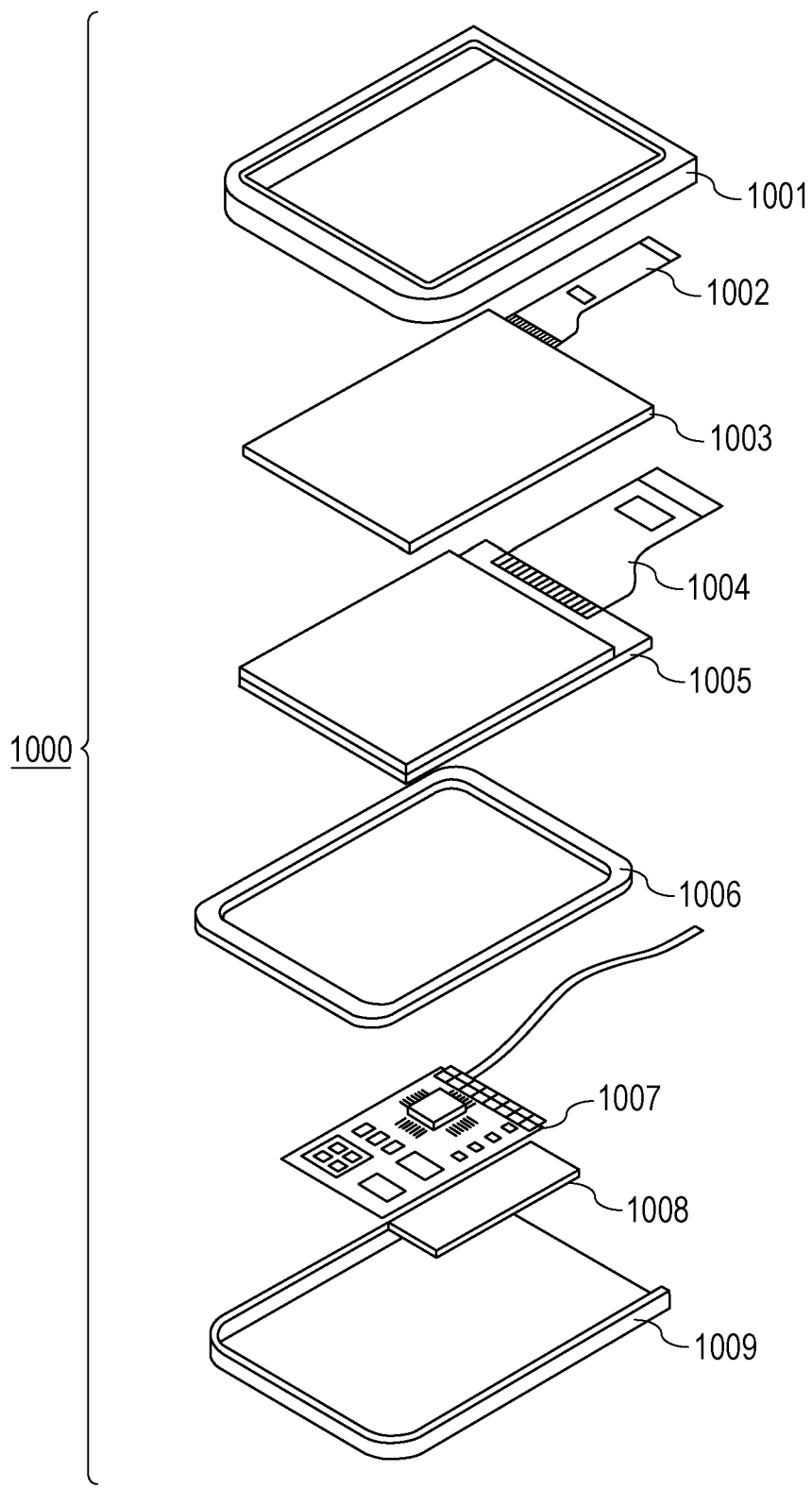
FIG. 6 is a schematic view illustrating an example of a display device according to an embodiment.

FIG. 6 is a schematic view illustrating an example of a display device according to the embodiment. A display device 1000 may include a touch screen 1003, a display panel 1005, a frame 1006, a circuit substrate 1007, and a battery 1008 disposed between an upper cover 1001 and a lower cover 1009. The touch screen 1003 and the display panel 1005 are coupled to flexible printed circuits FPCs 1002 and 1004, respectively. The display panel 1005 may include the organic electroluminescent element according to the embodiment. The circuit substrate 1007 includes a circuit containing a transistor. The battery 1008 need not be disposed unless the display device is a portable device. The battery 1008 need not be disposed at this position even if the display device is a portable device.

Figure 7A:
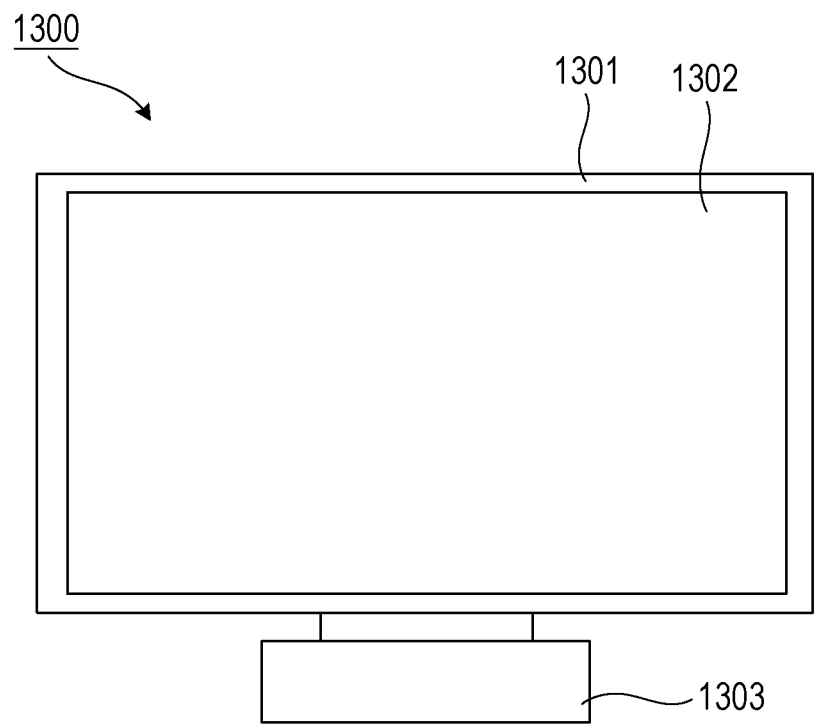
FIGS. 7A and 7B are schematic views illustrating examples of a display device according to an embodiment.
Figure 7B:
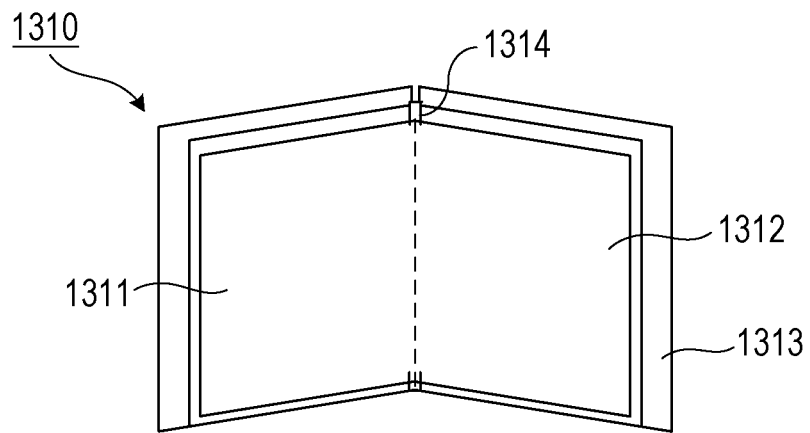

FIGS. 7A and 7B are schematic views illustrating examples of a display device according to the embodiment. FIG. 7A illustrates a display device, such as a television monitor or a personal computer monitor. A display device 1300 includes a frame 1301 and a display unit 1302. The display unit 1302 may include an organic electroluminescent element according to the embodiment. The display device 1300 also includes a base 1303 that supports the frame 1301 and the display unit 1302. The base 1303 is not limited to a form illustrated in FIG. 7A. The lower side of the frame 1301 may also serve as a base. The frame 1301 and the display unit 1302 may be curved and may have a radius of curvature of 5,000 mm or more and 6,000 mm or less. A display device 1310 illustrated in FIG. 7B can be folded and is what is called a foldable display device. The display device 1310 includes a first display portion 1311, a second display portion 1312, a housing 1313, and an inflection point 1314. The first display portion 1311 and the second display portion 1312 may include an organic electroluminescent element according to the embodiment. The first display portion 1311 and the second display portion 1312 may be a single, seamless display device. The first display portion 1311 and the second display portion 1312 can be divided from each other at the inflection point. The first display portion 1311 and the second display portion 1312 may display different images from each other. Alternatively, a single image may be displayed in the first and second display portions.

Image Pickup Apparatus

A display device according to the embodiment may be used for a display unit of an image pickup apparatus including an optical unit including multiple lenses and an image pickup element that receives light passing through the optical unit. The image pickup apparatus may include a display unit that displays information acquired by the image pickup element. The display unit may be a display unit exposed to the outside of the image pickup apparatus or a display unit disposed in a finder. The image pickup apparatus may be a digital camera or a digital camcorder.

Figure 8:
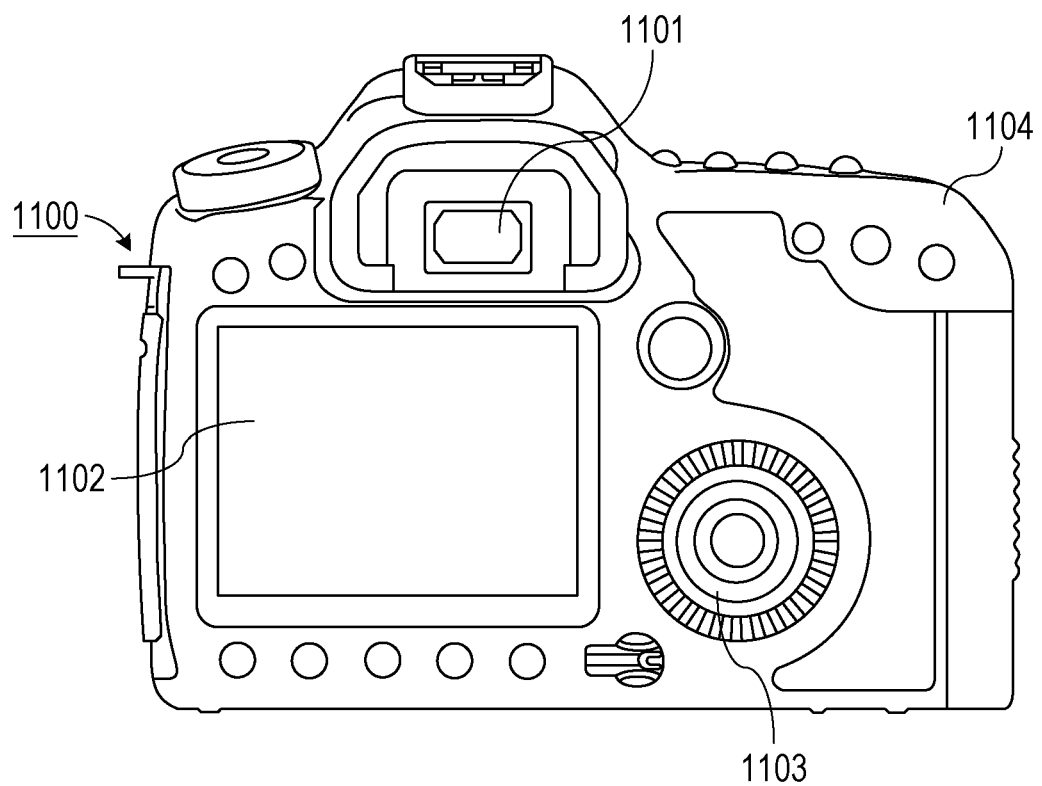
FIG. 8 is a schematic view illustrating an example of an image pickup apparatus according to an embodiment.

FIG. 8 is a schematic view illustrating an example of an image pickup apparatus according to the embodiment. An image pickup apparatus 1100 may include a viewfinder 1101, a rear display 1102, an operation unit 1103, and a housing 1104. The viewfinder 1101 may include a display device according to the embodiment. In this case, the display device may display environmental information, imaging instructions, and so forth in addition to an image to be captured. The environmental information may include, for example, the intensity of external light, the direction of external light, the moving speed of a photographic subject, and the possibility that a photographic subject is shielded by a shielding material. The timing suitable for imaging is only for a short time; thus, the information may be displayed as soon as possible. Accordingly, the display device including an organic electroluminescent element according to an embodiment of the present disclosure can be used because of its short response time. In apparatuses required to have high display speeds, the display device including the organic electroluminescent element can be used more suitably than liquid crystal displays. The image pickup apparatus 1100 includes an optical unit (not illustrated). The optical unit includes multiple lenses and is configured to form an image on an image pickup element in the housing 1104. The relative positions of the multiple lenses can be adjusted to adjust the focal point. This operation can also be performed automatically.

Electronic Apparatus

A display device according to the embodiment may be used for a display unit of an electronic apparatus, such as a portable terminal. In that case, the display device may have both a display function and an operation function. Examples of the portable terminal include mobile phones, such as smartphones, tablets, and head-mounted displays.

Figure 9:
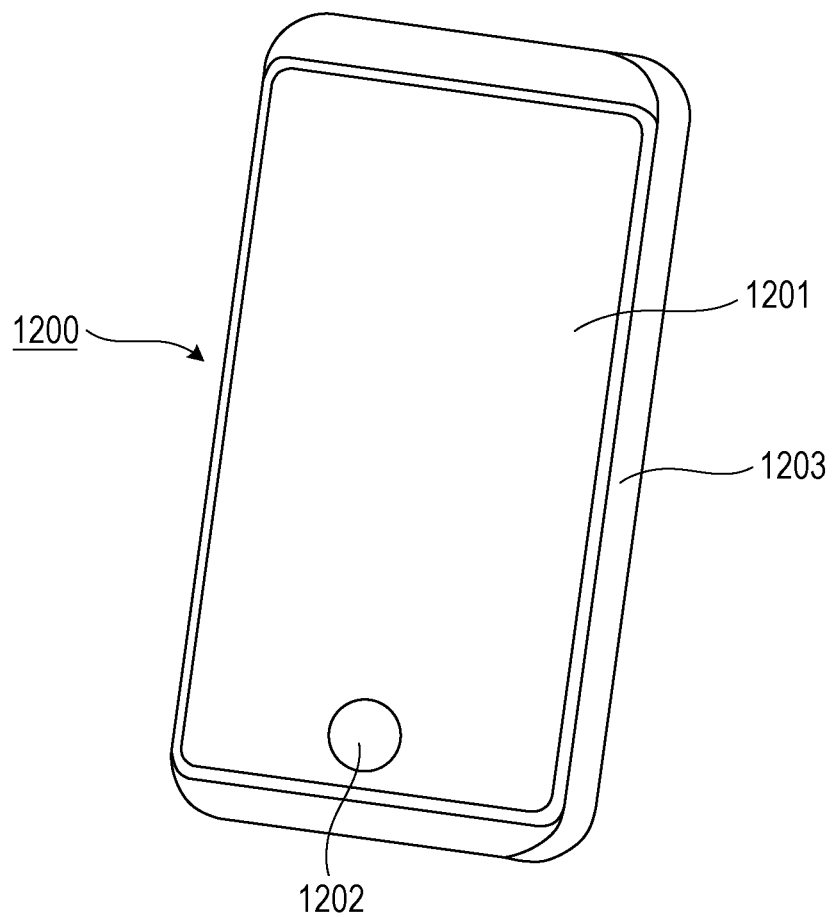
FIG. 9 is a schematic view illustrating an example of a portable device according to an embodiment.

FIG. 9 is a schematic view illustrating an example of an electronic apparatus according to the embodiment. An electronic apparatus 1200 includes a display unit 1201, an operation unit 1202, and a housing 1203. The housing 1203 may accommodate a circuit, a printed circuit board including the circuit, a battery, and a communication unit. The operation unit 1202 may be a button or a touch-screen-type reactive unit. The operation unit may be a biometric recognition unit that recognizes a fingerprint to release the lock or the like. An electronic apparatus having a communication unit can also be referred to as a communication apparatus.

Lighting Device

Figure 10:
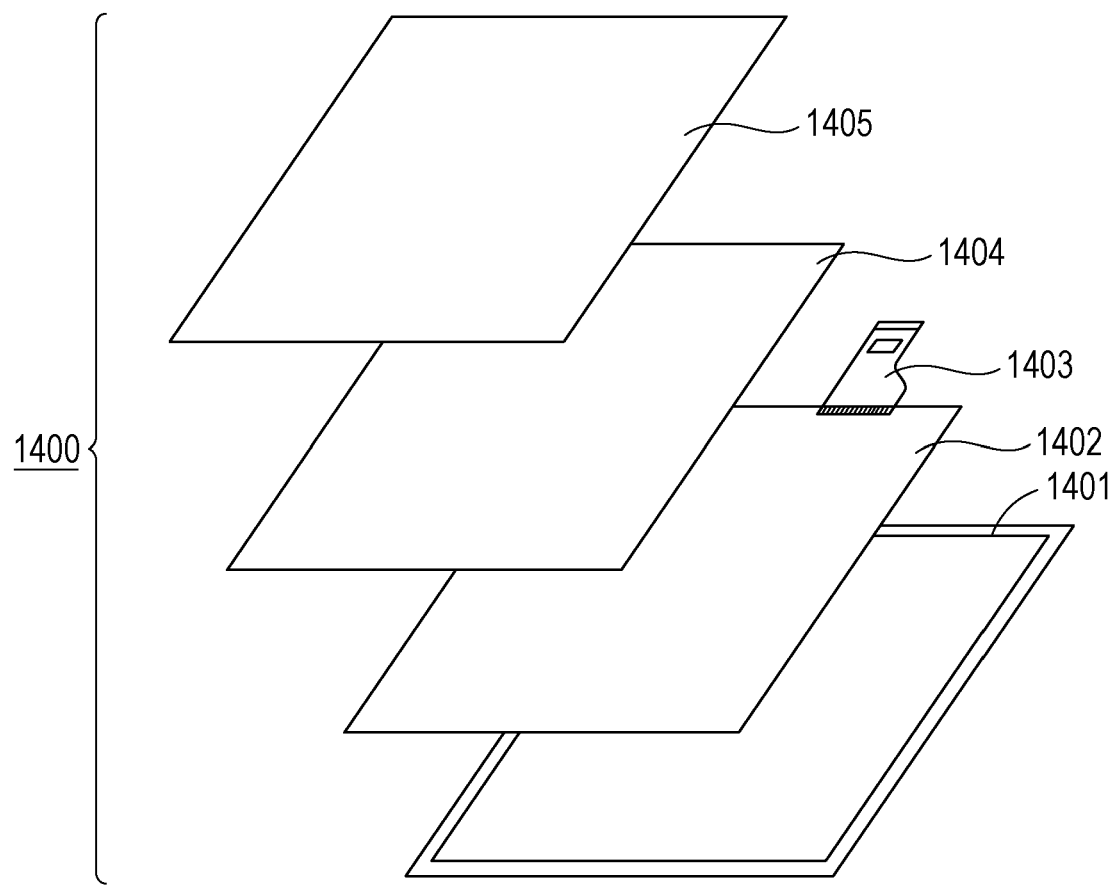
FIG. 10 is a schematic view illustrating an example of a lighting device according to an embodiment.

FIG. 10 is a schematic view illustrating an example of a lighting device according to the embodiment. A lighting device 1400 may include a housing 1401, a light source 1402, a circuit board 1403, an optical filter 1404, and a light diffusion unit 1405. The light source 1402 may include an organic electroluminescent element according to the embodiment. The optical filter 1404 may be a filter that improves the color rendering properties of the light source 1402. The light diffusion unit 1405 can effectively diffuse light from the light source 1402 to deliver the light to a wide range. The optical filter 1404 and the light diffusion unit 1405 may be disposed at the light emission side of the lighting device. A cover may be disposed at the outermost portion, as needed.

The lighting device is, for example, a device that lights a room. The lighting device may emit light of white, neutral white, or any color from blue to red. A light control circuit that controls the light may be provided. The lighting device may include an organic electroluminescent element according to an embodiment of the present disclosure and a power supply circuit coupled thereto. The power supply circuit is a circuit that converts an AC voltage into a DC voltage. The color temperature of white is 4,200 K, and the color temperature of neutral white is 5,000 K. The lighting device may include a color filter. The lighting device according to the embodiment may include a heat dissipation unit. The heat dissipation unit is configured to release heat in the device to the outside of the device and is composed of, for example, a metal having a high specific heat or liquid silicone.

Moving Object

Figure 11:
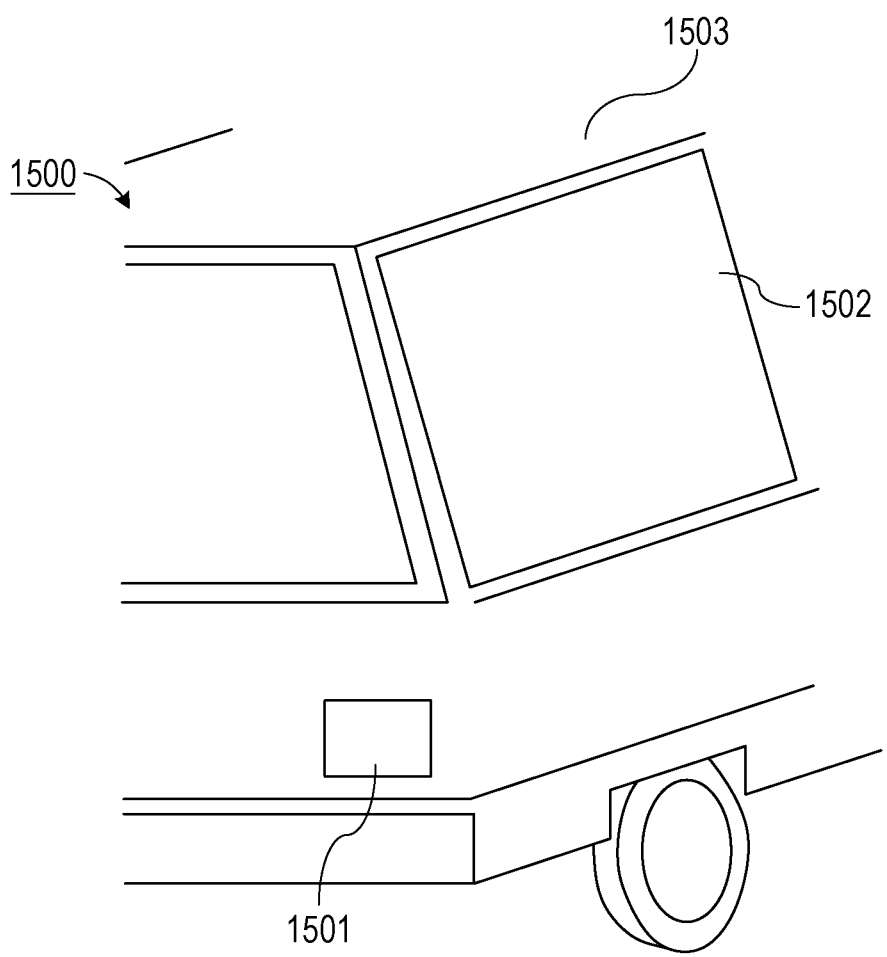
FIG. 11 is a schematic view illustrating an example of a moving object according to an embodiment.

A moving object according to the embodiment includes a body and a lighting unit disposed on the body. FIG. 11 is a schematic view illustrating an example of the moving object according to the embodiment and illustrates an automobile including a tail lamp, which is an example of a lighting unit for a vehicle. An automobile 1500 serving as a body includes a tail lamp 1501 and may be configured to light the tail lamp 1501 when a brake operation or the like is performed. The tail lamp 1501 may include an organic electroluminescent element according to the embodiment. The tail lamp 1501 may include a protective member that protects the organic electroluminescent element. The protective member may be composed of any transparent material having high strength to some extent and can be composed of, for example, polycarbonate. The polycarbonate may contain, for example, a furandicarboxylic acid derivative or an acrylonitrile derivative. The automobile 1500 may include a car body 1503 and a window 1502 attached thereto. The window 1502 may be a transparent display if the window is not used to check areas in front of and behind the automobile 1500. The transparent display may include an organic electroluminescent element according to the embodiment. In this case, the components, such as the electrodes, of the organic electroluminescent element are formed of transparent members.

The moving object according to the embodiment may be, for example, a ship, an aircraft, or a drone. The moving object may include a body and a lighting unit attached to the body. The lighting unit may emit light to inform someone of the position of the body. The lighting unit includes an organic electroluminescent element according to the embodiment.

EXAMPLES

Example 1 and Comparative Example 1

The effect of the present disclosure in a structure illustrated in FIG. 2 (provided that the number of organic electroluminescent elements was two) was simulated by a wave-optics simulation using a finite-difference time-domain (FDTD) method.

Example 1

Table 1 presents conditions for the implementation of a simulation model in Example 1.

TABLE 1

| Light emission medium | First color filter 101 | Refractive index: 1.7<br>Red-transmitting color filter<br>Thickness: 1.6 μm |
|---|---|---|
| | Second color filter 201 | Refractive index: 1.6<br>Green-transmitting color filter<br>Thickness: 1.6 μm |
| Planarization layer 7 | | Refractive index: 2.0<br>Refractive index was equal to or lower than refractive index of protective layer 6 and equal to or higher than refractive indices of color filters 101 and 201. |
| Protective layer 6 | | Refractive index: 2.0<br>Thickness: 2.0 μm<br>Surface thereof adjacent to planarization layer 7 had uneven shape 20 corresponding to shape of insulating layers 5 of first organic electroluminescent element 100 and second organic electroluminescent element 200. |
| Organic electroluminescent elements 100 and 200 | | White light emission<br>Insulating layer 5 with thickness of 65 nm was disposed at end portion of each lower electrode 2. |

Example 2

Conditions for the implementation of a simulation model in Example 2 were the same as in Example 1, except that the planarization layer 7 had a refractive index of 1.8.

Example 3

Conditions for the implementation of a simulation model in Example 3 were the same as in Example 1, except that the planarization layer 7 had a refractive index of 1.7.

Comparative Example 1

Conditions for the implementation of a simulation model in Comparative example 1 were the same as in Example 1, except that the planarization layer 7 had a refractive index of 1.5, which was lower than the refractive indices of the color filters 101 and 201.

Comparison of Simulation Results

When only the first organic electroluminescent element 100 emitted light, the emission intensity of green light emitted from the adjacent second color filter 201 (green-transmitting color filter) in a direction perpendicular to the substrate surface of the light-emitting device was evaluated. A comparison of the results of Example 1 and Comparative example 1 indicated that the green emission intensity in Example 1 is 40% lower than that in Comparative example 1. A comparison of the results of Example 2 and Comparative example 1 indicated that the green emission intensity in Example 2 is 34% lower than that in Comparative example 1. A comparison of the results of Example 3 and Comparative example 1 indicated that the green emission intensity in Example 3 is 24% lower than that in Comparative example 1. That is, the results demonstrated that in light passing through the color filter in the configuration of each of Examples 1 to 3, the color mixing of green with red light emission can be suppressed. Accordingly, the results demonstrated that the configuration according to embodiments of the present disclosure results in the high-color-purity light-emitting device.

Example 4

A light-emitting device having a structure illustrated in FIG. 2 was produced according to the following procedure: The lower electrodes 2 composed of aluminum were formed by patterning on the substrate 1. The insulating layers 5 were formed between the lower electrodes 2. Each of the insulating layers 5 was formed of a silicon oxide film. The insulating layers 5 had a thickness of 65 nm. Aperture portions (light-emitting regions) of the insulating layers 5 in a pixel had the same size.

The organic compound layer 3 was formed on the lower electrodes 2. Specifically, as a hole injection layer, Compound 1 was deposited to a thickness of 3 nm. As a hole transport layer, Compound 2 was deposited to a thickness of 15 nm. As an electron blocking layer, Compound 3 was deposited to a thickness of 10 nm. A first light-emitting layer was formed to a thickness of 10 nm, the first light-emitting layer containing 97% by mass Compound 4 serving as a host material and 3% by mass Compound 5 serving as a light-emitting dopant. A second light-emitting layer was formed to a thickness of 10 nm, the second light-emitting layer containing 98% by mass Compound 4 serving as a host material, 1% by mass of Compound 6, and 1% by mass of Compound 7, Compounds 6 and 7 serving as light-emitting dopants. Compound 8 was deposited as an electron transport layer to a thickness of 100 nm. Lithium fluoride was deposited as an electron injection layer to a thickness of 1 nm.

Compound 1

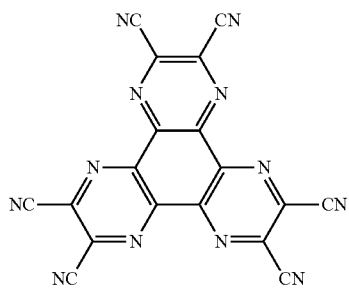

Compound 2

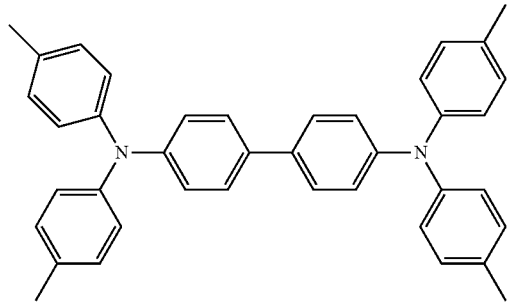

Compound 3

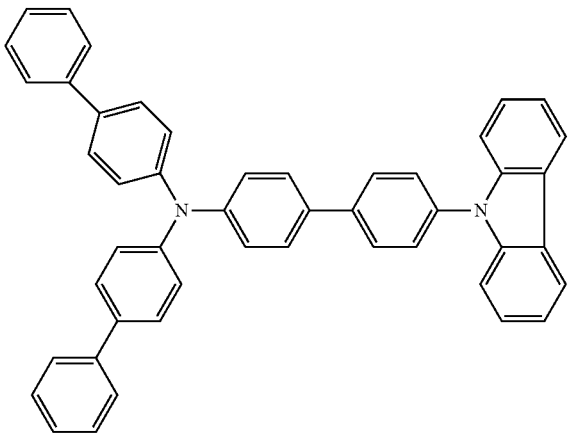

Compound 4

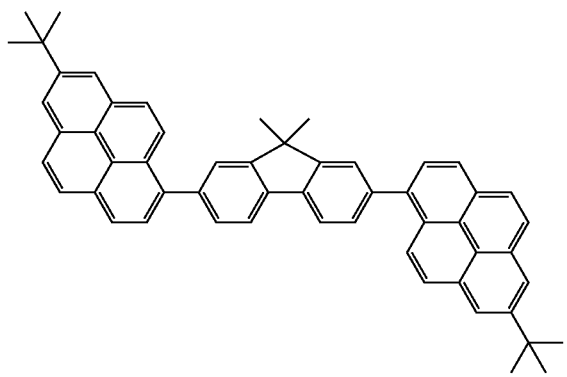

Compound 5

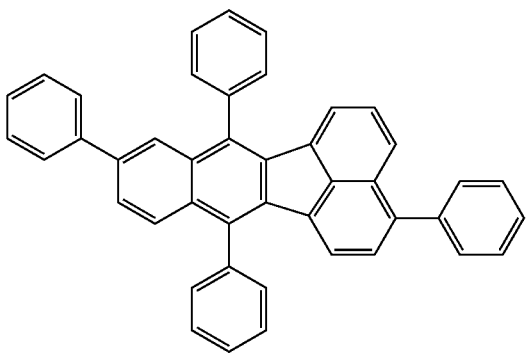

-continued

Compound 6

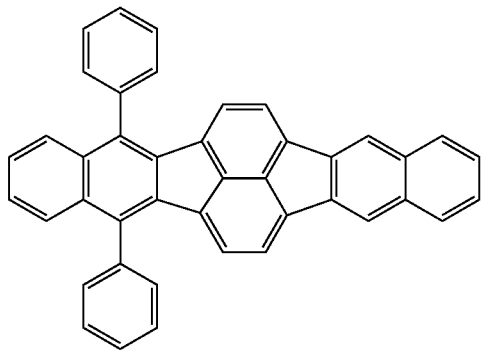

Compound 7

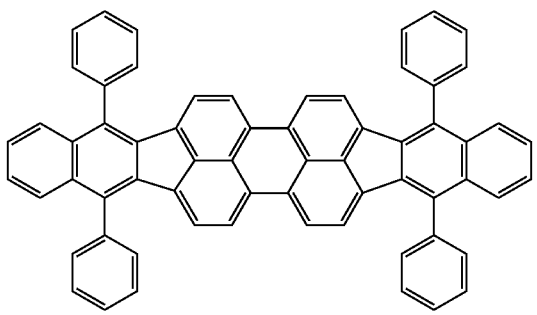

Compound 8

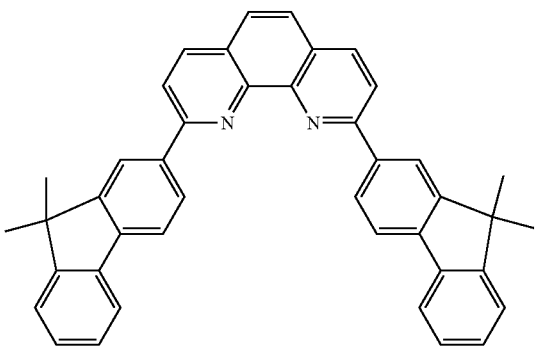

A MgAg alloy was deposited as the upper electrode 4 to a thickness of 10 nm. The ratio of Mg to Ag was 1:1.

As the protective layer 6, a SiN film was formed to a thickness of 2 μm by a CVD method. The light emission side of the protective layer 6 had the uneven shape 20 corresponding to the shape of the insulating layers 5 formed in the first organic electroluminescent element 100, the second organic electroluminescent element 200, and the third organic electroluminescent element 300.

As the planarization layer 7, a polymer film containing titanium oxide nanoparticles dispersed therein was formed to a thickness of 300 nm. After the film formation, curing treatment was performed by UV irradiation. The light emission side of the planarization layer 7 was flat.

Color filters were formed on the planarization layer 7. As the color filters, color filters of three colors, i.e., red, green, and blue color filters, were arranged. For the first organic electroluminescent element 100, the red color filter was disposed as the first color filter 101. For the second organic electroluminescent element 200, the green color filter was disposed as the second color filter 201. For the third organic electroluminescent element 300, the blue color filter was disposed as the third color filter 301. As a red color resist, an acrylic resin containing a perylene-based material dispersed therein was used. As blue and green color resists, acrylic resins containing phthalocyanine-based materials dispersed therein were used.

The opposite substrate 9 was formed of a glass substrate having flat upper and lower surfaces. The filling layer 8 composed of a photocurable acrylic resin was disposed between the opposite substrate 9 and the color filters 101, 201, and 301.

The refractive indices of the protective layer 6, the planarization layer 7, and the color filters 101, 201, and 301 were measured with an ellipsometer and presented in Table 2.

TABLE 2

| | | Refractive index |
|---|---|---|
| Light emission medium | first color filter 101 | 1.7 |
| | second color filter 201 | 1.6 |
| | third color filter 301 | 1.6 |
| Planarization layer 7 | | 1.8 |
| Protective layer 6 | | 2.0 |

The present disclosure enables the suppression of stray light due to the uneven shape of a protective layer without decreasing reliability or increasing costs. It is thus possible to provide an organic electroluminescent element in which light bleeding in a light-emitting region is suppressed or to provide a high-color-purity organic electroluminescent element in which color mixture is suppressed.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-030064 filed Feb. 22, 2019, which is hereby incorporated by reference herein in its entirety.

What is claimed is:

1. An organic electroluminescent element, comprising:
   a first electrode;
   a second electrode; and
   an organic compound layer disposed between the first electrode and the second electrode,
   wherein a protective layer and a planarization layer are disposed in this order on a light emission side of whichever of the first electrode and the second electrode is closer to the light emission side,
   a surface of the protective layer adjacent to the planarization layer has an uneven shape,
   the planarization layer is in contact with the protective layer, a surface of the planarization layer away from the protective layer being flat, and
   a refractive index of the planarization layer is equal to or lower than a refractive index of the protective layer and equal to or higher than a refractive index of a light emission medium in contact with the planarization layer.

2. The organic electroluminescent element according to claim 1, wherein the planarization layer is composed of a composite material containing a polymeric material and at least one member selected from the group consisting of titanium oxide, zirconium oxide, diamond, silicon nitride, and barium titanate, or is composed of a polymeric material containing at least one element selected from the group consisting of sulfur, bromine, iodine, and phosphorus.

3. The organic electroluminescent element according to claim 1, wherein the light emission medium is a color filter.

4. The organic electroluminescent element according to claim 1, wherein the uneven shape is provided in a peripheral region of a light-emitting region when viewed in plan.

5. The organic electroluminescent element according to claim 1, wherein the uneven shape corresponds to a shape of a structure disposed on an opposite side of the protective layer from the planarization layer.

6. The organic electroluminescent element according to claim 1, wherein the planarization layer has a refractive index of 1.7 or more and 2.0 or less.

7. A light-emitting device, comprising:
multiple light-emitting elements,
wherein at least one of the light-emitting elements is the organic electroluminescent element according to claim 1.

8. The light-emitting device according to claim 7, wherein the uneven shape is provided in a boundary region between adjacent light-emitting regions when viewed in plan.

9. The light-emitting device according to claim 8, wherein the protective layer is disposed in common with the multiple light-emitting elements.

10. A display device, comprising:
multiple pixels,
wherein at least one of the multiple pixels includes the organic electroluminescent element according to claim 1 and an active element connected to the organic electroluminescent element.

11. An image pickup apparatus, comprising:
an optical unit including multiple lenses;
an image pickup element to receive light passing through the optical unit; and
a display unit,
wherein the display unit displays information acquired by the image pickup element and includes the display device according to claim 10.

12. An electronic apparatus, comprising:
a housing;
a communication unit to communicate with an outside; and
a display unit,
wherein the display unit includes the display device according to claim 10.

13. A lighting device, comprising:
a light source; and
a light diffusion unit or an optical filter,
wherein the light source includes the organic electroluminescent element according to claim 1.

14. A moving object, comprising:
a body; and
a lighting unit disposed on the body,
wherein the lighting unit includes the organic electroluminescent element according to claim 1.

* * * * *